United States Patent
Morin et al.

(10) Patent No.: US 9,490,355 B2
(45) Date of Patent: Nov. 8, 2016

(54) SILICON CARBIDE STATIC INDUCTION TRANSISTOR AND PROCESS FOR MAKING A SILICON CARBIDE STATIC INDUCTION TRANSISTOR

(71) Applicant: STMicroelectronics, Inc., Coppell, TX (US)

(72) Inventors: Pierre Morin, Albany, NY (US); John Hongguang Zhang, Fishkill, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 14/945,936

(22) Filed: Nov. 19, 2015

(65) Prior Publication Data

US 2016/0133736 A1    May 12, 2016

Related U.S. Application Data

(62) Division of application No. 14/538,877, filed on Nov. 12, 2014, now Pat. No. 9,224,845.

(51) Int. Cl.
| | | |
|---|---|---|
| H01L 29/772 | (2006.01) | |
| H01L 29/66 | (2006.01) | |
| H01L 27/02 | (2006.01) | |

(Continued)

(52) U.S. Cl.
CPC ....... *H01L 29/7722* (2013.01); *H01L 21/0475* (2013.01); *H01L 21/0485* (2013.01); *H01L 21/308* (2013.01); *H01L 27/0225* (2013.01); *H01L 27/14679* (2013.01); *H01L 29/0619* (2013.01); *H01L 29/0623* (2013.01); *H01L 29/0843* (2013.01); *H01L 29/1608* (2013.01); *H01L 29/41766* (2013.01); *H01L 29/66068* (2013.01); *H01L 29/66416* (2013.01)

(58) Field of Classification Search
CPC ............ H01L 29/66416; H01L 29/7722; H01L 27/14679; H01L 27/0225
See application file for complete search history.

(56) References Cited

U.S. PATENT DOCUMENTS

| 7,557,389 B2 | 7/2009 | Amasuga et al. |
| 2011/0049532 A1 | 3/2011 | Odekirk et al. |
| 2012/0139013 A1* | 6/2012 | Bahl .................. H01L 29/7722 257/266 |

OTHER PUBLICATIONS

Yano, Koji: "Short-Circuit Capability of SiC Buried-Gate Static Induction Transistors: Basic Mechanism and Impacts of Channel Width on Short-Circuit Performance," IEEE Transactions on Electron Devices, vol. 57, No. 4 Apr. 2010 (pp. 919-927).

(Continued)

*Primary Examiner* — Thanhha Pham
(74) *Attorney, Agent, or Firm* — Gardere Wynne Sewell LLP (57) ABSTRACT

A static induction transistor is formed on a silicon carbide substrate doped with a first conductivity type. First recessed regions in a top surface of the silicon carbide substrate are filled with epitaxially grown gate regions in situ doped with a second conductivity type. Epitaxially grown channel regions in situ doped with the first conductivity type are positioned between adjacent epitaxial gate regions. Epitaxially grown source regions in situ doped with the first conductivity type are positioned on the epitaxial channel regions. The bottom surface of the silicon carbide substrate includes second recessed regions vertically aligned with the channel regions and silicided to support formation of the drain contact. The top surfaces of the source regions are silicided to support formation of the source contact. A gate lead is epitaxially grown and electrically coupled to the gate regions, with the gate lead silicided to support formation of the gate contact.

24 Claims, 7 Drawing Sheets

(51) Int. Cl.
  *H01L 29/16* (2006.01)
  *H01L 29/08* (2006.01)
  *H01L 21/04* (2006.01)
  *H01L 21/308* (2006.01)
  *H01L 27/146* (2006.01)
  *H01L 29/417* (2006.01)
  *H01L 29/06* (2006.01)

(56) References Cited

OTHER PUBLICATIONS

Nishizawa, J. et al: "Power Devices. Static Induction Thyristor," Revue De Physique Appliquee, Dec. 13, 1978 (pp. 725-728).

* cited by examiner

SILICON CARBIDE STATIC INDUCTION TRANSISTOR AND PROCESS FOR MAKING A SILICON CARBIDE STATIC INDUCTION TRANSISTOR

CROSS-REFERENCE TO RELATED APPLICATION

This application is a divisional application from U.S. patent application Ser. No. 14/538,877 filed Nov. 12, 2014 the disclosure of which is incorporated by reference.

TECHNICAL FIELD

The present invention relates to the fabrication of integrated circuits and, more particularly, to a process for fabricating a silicon carbide (SiC) static induction transistor (SIT).

BACKGROUND

The choice of a semiconductor material for switching electrical currents on and off depends on the operating voltage and how much current must be controlled. Silicon is an excellent material for use in low-power transistors, but for high currents and voltages, the implementation of silicon-based switching devices becomes complex and thermal management issues arise.

For high-voltage, high-current devices that can be operated at elevated temperatures, silicon carbide (SiC) is recognized by those skilled in the art as the material of choice for transistor fabrication. The most readily synthesized hexagonal polytypes, 4H and 6H, for SiC substrates have a large indirect band gap (~3.2 eV) and a large breakdown electric field (2 MV cm$^{-1}$), as well as high electron mobility (900 cm$^2$ V$^{-1}$ s$^{-1}$) and thermal conductivity (400 W m$^{-1}$ K$^{-1}$). Given these properties, SiC-based power switches may exhibit performance figures of merit ten to one hundred times that of a silicon substrate switch.

Silicon carbide (SiC) static induction transistors (SITs) are well known in the art. Such transistors may, for example, be used in high power radio frequency (RF) applications. Devices of the SiC SIT type exhibit a superior performance characterized by ultra-low power loss. For example, a known 600 V~1.2 kV class switching device has been shown to have a breakdown voltage ($V_{BR}$) of 700 V and a specific on-resistance ($R_{onS}$) of 1.01 mΩ·cm$^2$.

The fabrication of SiC SIT devices has typically utilized an ionic implantation technique. For example, current fabrication processes use high energy for the n$^+$ region dopant. The dopant implant, however, can cause damage to the SiC substrate leading to concerns with device reliability (such as leakage). To address this concern, the prior art teaches the fabrication of a dual mesa SiC SIT device using a lower energy implant, but this process unfortunately requires an increase in process steps and a higher fabrication cost.

There is accordingly a need in the art to address the foregoing and other concerns with the fabricating of SiC SIT devices.

SUMMARY

In an embodiment, a static induction transistor (SIT) comprises: a silicon carbide substrate doped with a first conductivity type and including a plurality of first recessed regions in a top surface of the silicon carbide substrate; a plurality of epitaxial gate regions within the first recessed regions and which are in situ doped with a second conductivity type; a plurality of epitaxial channel regions positioned between adjacent epitaxial gate regions and which are in situ doped with the first conductivity type; and a plurality of epitaxial source regions on said plurality of epitaxial channel regions and which are in situ doped with the first conductivity type.

In an embodiment, a method for fabricating a static induction transistor (SIT) comprises: forming a plurality of first recessed regions in a top surface of a silicon carbide substrate doped with a first conductivity type; epitaxially growing a plurality of gate regions within the first recessed regions; in situ doping the gate regions with a second conductivity type; epitaxially growing a plurality of channel regions positioned between adjacent gate regions; in situ doping the channel regions with the first conductivity type; epitaxially growing a plurality of source regions on said plurality of channel regions; and in situ doping the source regions with the first conductivity type.

In an embodiment, a static induction transistor (SIT) comprises: a silicon carbide substrate doped with a first conductivity type and including a plurality of first recessed regions in a top surface of the silicon carbide substrate; a plurality of epitaxial gate regions within the first recessed regions having an in situ second conductivity type dopant; a plurality of epitaxial channel regions positioned between adjacent epitaxial gate regions having an in situ first conductivity type dopant; and a plurality of epitaxial source regions on said plurality of epitaxial channel regions having an in situ first conductivity type dopant.

In an embodiment, a static induction transistor (SIT) comprises: a first layer of silicon carbide doped with a first conductivity type dopant to form a drain region and including a plurality of first recesses in a top surface of said first layer of silicon carbide; a gate region within each first recess, said gate region formed by epitaxial silicon carbide doped with a second conductivity type dopant; a channel region positioned between adjacent gate regions, said channel region formed by epitaxial silicon carbide doped with the first conductivity type dopant; and a second layer of silicon carbide doped with the first conductivity type dopant overlying the gate regions to form a source region.

In an embodiment, a static induction transistor (SIT) comprises: a silicon carbide substrate doped with a first conductivity type dopant at a first dopant concentration to form a drain region and including a plurality of first recesses in a top surface of said silicon carbide substrate; a gate region within each first recess, said gate region formed by epitaxial silicon carbide doped with a second conductivity type dopant; a channel region positioned between adjacent gate regions, said channel region formed by epitaxial silicon carbide doped with the first conductivity type dopant at a second dopant concentration less than said first dopant concentration; and a source region positioned between adjacent gate regions over each channel region and formed by epitaxial silicon carbide doped with the first conductivity type dopant at a third dopant concentration more than said second dopant concentration.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 1-18 showing process steps for fabricating an integrated circuit comprising a silicon carbide (SiC) static induction transistor (SIT) device. It will be understood that the illustrations provided do not necessarily show the features drawn to scale.

Figure 1:
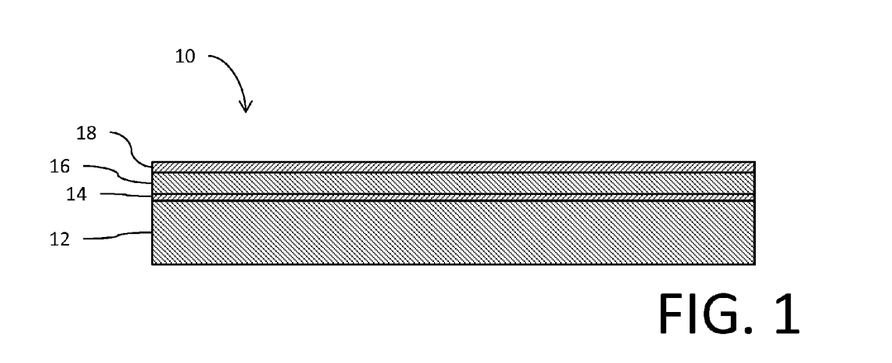
FIGS. 1-18 show process steps in accordance with an embodiment for fabricating a static induction transistor (SIT)

A substrate wafer 10 is provided as shown in FIG. 1. The wafer 10 includes silicon carbide (SiC) substrate wafer 12 having a thickness, for example, of 300 µm. The SiC substrate wafer 12 may, for example, be of the 4H polytype. Alternatively, the wafer 12 may be the 6H polytype or 3C polytype, or any other suitable polytype of SiC. The layer 12 is preferably more heavily doped with a first conductivity type, for example, n-type, dopant (n+) and has a resistivity less than 0.10 ohm-cm. An SiC buffer layer 14 is grown on top of the wafer 12 having a thickness, for example, of 0.0025 to 1.0 µm. This buffer layer 14 is preferably heavily doped with the first (n-type) conductivity (n+) and may have a typical donor concentration of $5\times10^{17}$ to $1\times10^{19}$ atoms $cm^{-3}$. A SiC drift layer 16 is grown on top of the buffer layer 14 having a thickness, for example, of 0.0001 to 15 µm. The drift layer 16 is preferably lightly doped with the first (n-type) conductivity (n−) and may have a typical donor concentration of $1\times10^{15}$ to $1\times10^{17}$ atoms $cm^{-3}$. The drift layer 16 functions to provide a desired transistor blocking voltage level. The wafer 10 may further optionally include a SiC channel layer 18 grown on top of the drift layer 16 having a thickness, for example, of 0.0005 to 5 µm. The channel layer 18 is preferably lightly doped with the first (n-type) conductivity (n−) and may have a typical donor concentration of $1\times10^{16}$ to $5\times10^{17}$ atoms $cm^{-3}$. The channel layer 18 is configured to provide efficient channel conduction characteristics.

Figure 2:
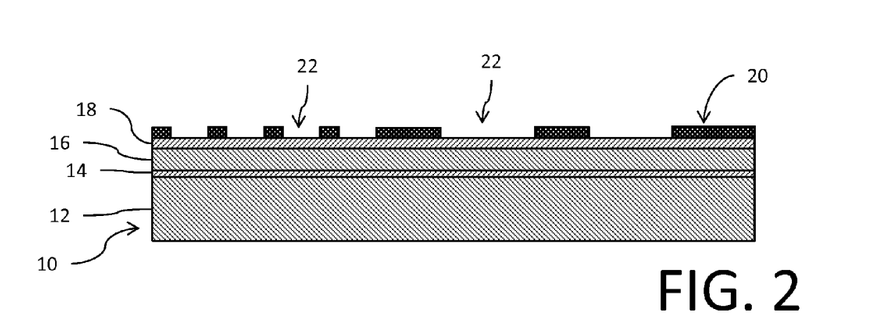

As shown in FIG. 2, a hard mask 20 is deposited on the top surface of the wafer 10 and patterned using conventional lithographic process techniques well known to those skilled in the art to define a number of mask openings 22. The hard mask 20 may comprise a silicon dioxide ($SiO_2$ or SiO) material, a silicon nitride (SiN) material, or a silicon oxinitride (SiON) material, that is deposited by thermal chemical vapor deposition (CVD) or plasma enhanced chemical vapor deposition (PECVD) techniques known to those skilled in the art. The hard mask 20 may have a thickness, for example, of 0.03 to 1.0 µm.

Figure 3:
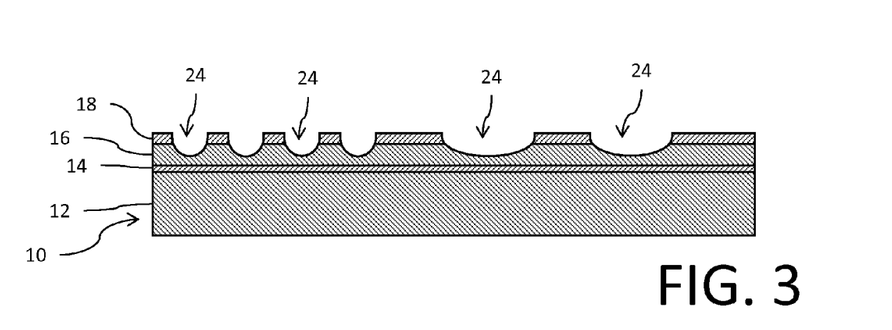

A wet or dry etch (for example, using NaOH at 350° C. (not isotropic) or fluorine-based temperature assisted RF plasma etch with aluminum nitride hard mask (isotropic)) is then performed remove portions of the wafer 10 exposed through the openings 22 in the hard mask 20. The etch process produces recessed regions 24 in the top surface of the wafer 10. The recessed regions 24 may have a depth, for example, of 0.001-1 µm, and preferably extend completely through the channel layer 18 (if present) and at least partially into the drift layer 16. The result of the etch process, following a subsequent removal of the hard mask 20, is shown in FIG. 3.

Figure 4:
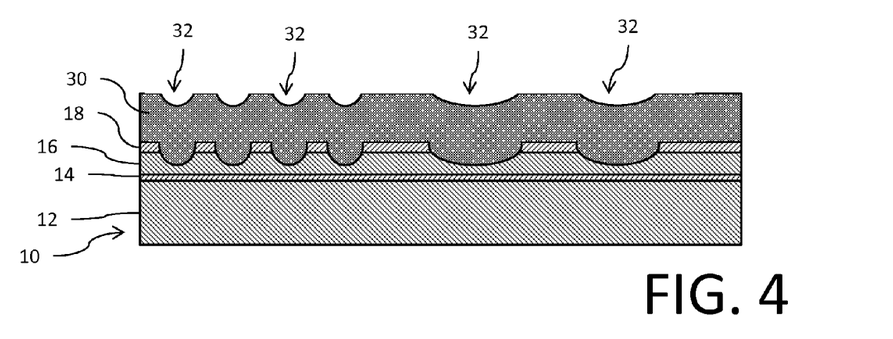

An epitaxial growth process as known to those skilled in the art is then performed to grow an epitaxial silicon carbide (SiC) layer 30 overlying the wafer 10. The result is shown in FIG. 4. The layer 30 fills the recessed regions 24 left in the wafer 10 by the etch process of FIG. 3. The layer 30 is preferably in situ heavily doped with a second conductivity type, for example, p-type, dopant (p+) and may have a typical donor concentration of $1\times10^{16}$ to $5\times10^{18}$ atoms $cm^{-3}$. The layer 30 may, for example, have a thickness of 0.0001 to 5 µm. Because of the conformal nature of the epitaxial growth process, the upper surface of the layer 30 will include recessed regions 32 (generally vertically corresponding in location to the regions 24).

Figure 5:
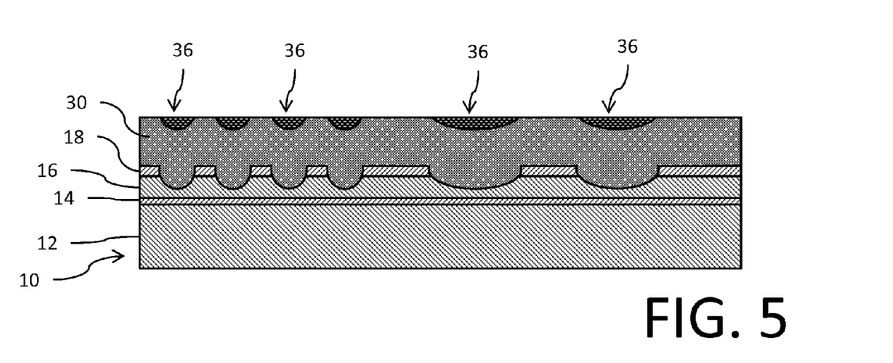

A hard mask 36 is deposited on the top surface of the wafer 10 over the layer 30. The hard mask 20 may comprise a silicon dioxide ($SiO_2$ or SiO) material, a silicon nitride (SiN) material, or a silicon oxinitride (SiON) material, that is deposited by thermal chemical vapor deposition (CVD) or plasma enhanced chemical vapor deposition (PECVD) techniques known to those skilled in the art. The hard mask 36 may have a thickness, for example, of 0.03 to 1.0 µm. The deposition of the hard mask is conformal and thus will fill the recessed regions 32. A chemical-mechanical polishing (CMP) process as known to those skilled in the art is then used to remove the overlying portions of the hard mask 36 material which are not located within the recessed regions 32. The CMP process accordingly stops at the top surface of the epitaxial layer 30. The result is shown in FIG. 5.

Figure 6:
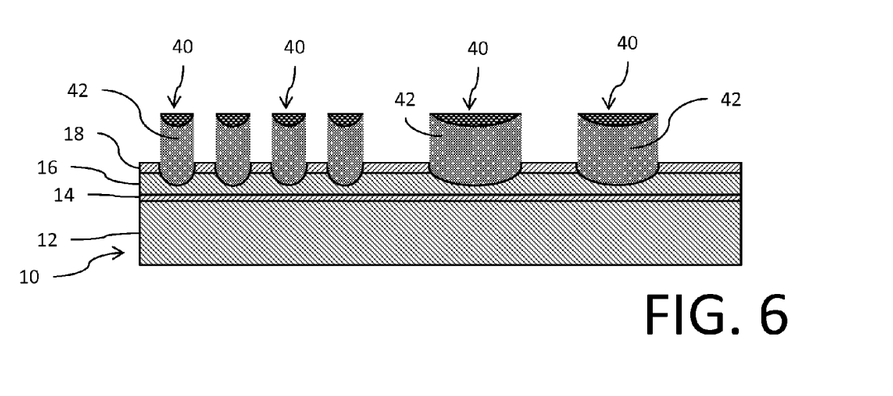

The hard mask material which remains in the recessed regions 32 forms a block mask 40 for use in self-aligned channel formation. A selective etch, for example, a reactive ion etch (RIE), is applied to the wafer to remove portions of the epitaxial layer 30 that are not protected by the block mask 40 and leave remaining portions 42 of the epitaxial layer 30. The result is shown in FIG. 6. It will be understood that this etch may remove a portion of the substrate 10 at the top surface (this fact not explicitly illustrated in FIG. 6). For the epitaxial regrowth reasons discussed below, however, this material removal is of no consequence.

Figure 7:
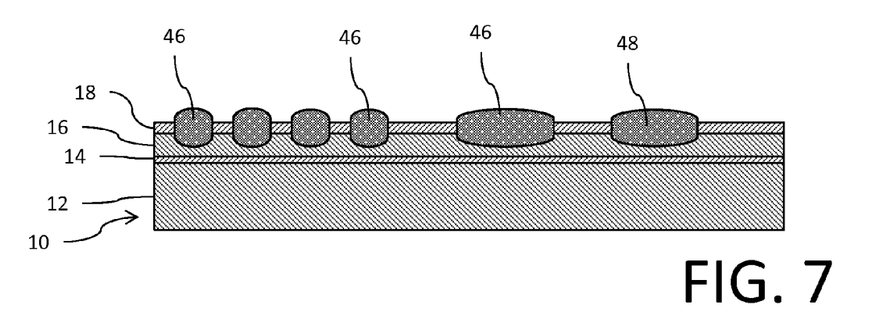

A further selective etch, for example, a reactive ion etch (RIE), is applied to the wafer to remove the block mask 40 along with portions of the remaining portions 42 to leave gate regions 46 and guard regions 48 formed of the p+ doped material provided by layer 30. The result is shown in FIG. 7. It will be understood that this etch may remove a portion of the substrate 10 at the top surface (this fact not explicitly illustrated in FIG. 7). For the epitaxial regrowth reasons discussed below, however, this material removal is of no consequence.

The RIE processes performed on the epitaxial layer 30 define the channel length of the transistor (i.e., the length in the vertical direction from top to the bottom of the p-type region) and the channel width of the transistor (i.e., the horizontal distance between p-type regions). The channel length so defined determines the transconductance ($g_m$) of the transistor, and the channel length and channel width together determine the $V_p$ of the transistor. The total gate capacitance ($C_{gg}$) is determined by the perimeter length of the p-type gate region 46, and includes intrinsic gate capacitance in the vertical direction of the channel mesa and extrinsic "parasitic" gate capacitance in the horizontal direction between channel mesas. The transistor cutoff frequency, $f_t$, depends on the ratio: $g_m/C_{gg}$. Therefore, it is beneficial to minimize $C_{gg}$ and maximize $g_m$ in order to achieve a desired high-frequency power amplification.

Figure 8:
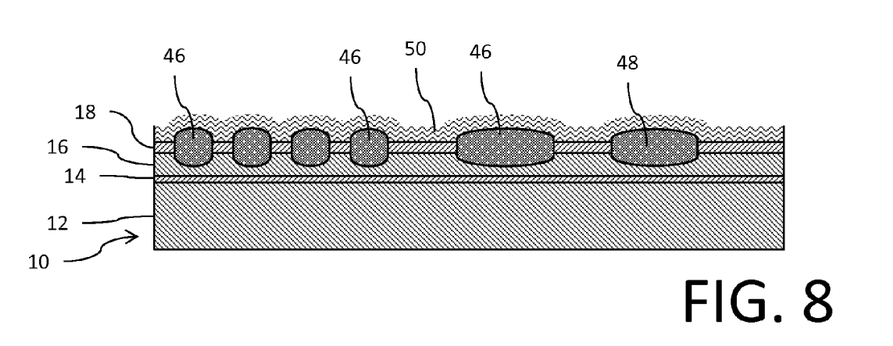

A conformal insulating material layer 50 is then deposited on the wafer 10 to cover the gate regions 46, ring region 48 and the channel layer 18. The layer 50 may, for example, comprise an oxide layer (such as, silicon dioxide $SiO_2$) or a high K dielectric oxide material (such as, halfnium oxide $HfO_2$). The layer 50 may have a thickness of 0.0001-0.1 µm, and be deposited using a plasma enhanced chemical vapor deposition (PECVD) or physical vapor deposition (PVD) process as known in the art. The result is shown in FIG. 8.

Figure 9:
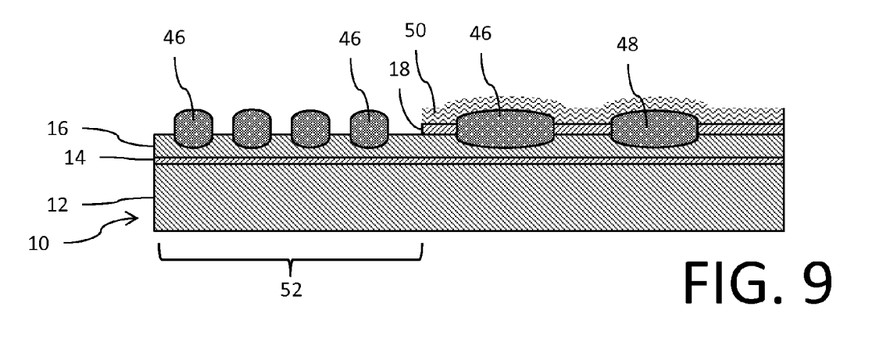

Using masking and lithography techniques well known to those skilled in the art, the layer 50 is removed over regions 52 of the wafer 10 as shown in FIG. 9. A selective reactive ion etch (RIE) performed through a patterned mask may, for example, be used to selectively open the upper surface of the wafer 10 in the region 52. This etch will remove, in the region 52, all or a substantial portion of the channel layer 18 (and may extended into the layer 16 as well). For the epitaxial regrowth reasons discussed below, however, this material removal is of no consequence.

Figure 10:
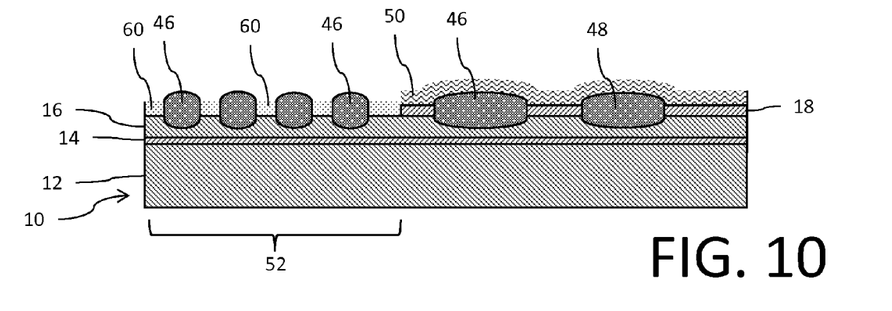

An epitaxial regrowth process as known to those skilled in the art is then performed to grow an epitaxial silicon carbide (SiC) layer 60 overlying exposed n-type substrate portions of the wafer 10 in the region 52. The result is shown in FIG. 10. The layer 60 fills the spaces between the gate regions 46 left in the wafer 10 by the etch process of FIG. 9. The layer 50 is preferably in situ lightly doped with first (n-type) conductivity dopant (n−) and may have a typical donor concentration of $1\times10^{16}$ to $1\times10^{18}$ atoms cm$^{-3}$. The layer 60 may, for example, have a thickness of 0.0005 to 5 μm. In this regard, it is important to note that because of lattice mismatch, the n− epitaxial growth will grow faster than the p+ epitaxial growth. Although not explicitly illustrated in FIG. 9, a thin portion of epitaxial silicon carbide (SiC) layer 60 may be formed on the top surface of the gate regions 46. This is not a concern, however, because the overlying deposit is consistent with the formation of a PN junction to support device operation.

The layer 60 between adjacent gate regions 46 is provided to define channel regions for the transistor. This epitaxial regrowth of first (n-type) conductivity material serves to repair damage made to the channel layer 18 as a result of the previous RIE process (FIG. 9). The regrowth accordingly forms a high quality short first conductivity type channel for the transistor which will support high frequency operation.

Figure 11:
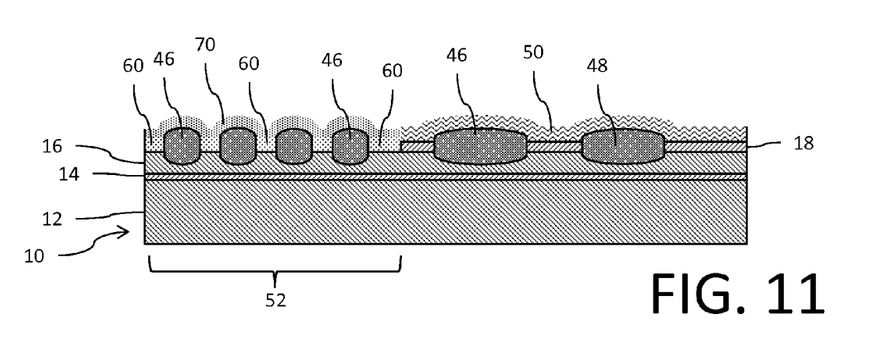

An epitaxial growth process as known to those skilled in the art is then performed to grow an epitaxial silicon carbide (SiC) layer 70. The result is shown in FIG. 11. The layer 70 conformally covers the layer 60 and gate regions 46. The layer 70 is preferably in situ heavily doped with first (n-type) conductivity dopant (n+) and may have a typical donor concentration of $1\times10^{18}$ to $2\times10^{19}$ atoms cm$^{-3}$. The layer 70 may, for example, have a thickness of 0.0001 to 5 μm. The layer 70 is provided to define source regions for the transistor, with the heavily doped first (n-type) conductivity material facilitating the formation of ohmic contacts to the source region as will be discussed below.

Figure 12:
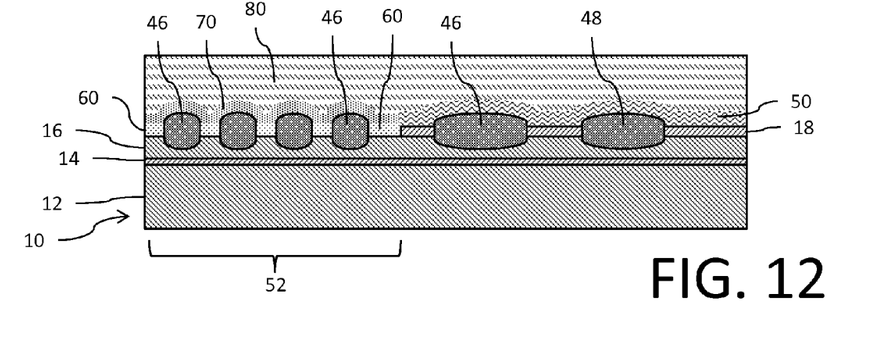

A dielectric layer 80 is then deposited on the wafer 10. The layer 80 may, for example, comprise an ultra-low K (ULK) material (such as OMCATS as known in the art) deposited using a PECVD process. The layer 80 may have a thickness of 0.2-2 μm. The process for depositing the layer 80 may result in a non-uniform thickness of layer 80 across the surface area of the wafer 10. A chemical-mechanical polishing (CMP) process as known to those skilled in the art may be used after layer 80 deposit in order to provide a uniform desired thickness and planar top surface for layer 80. The result is shown in FIG. 12.

Figure 13:
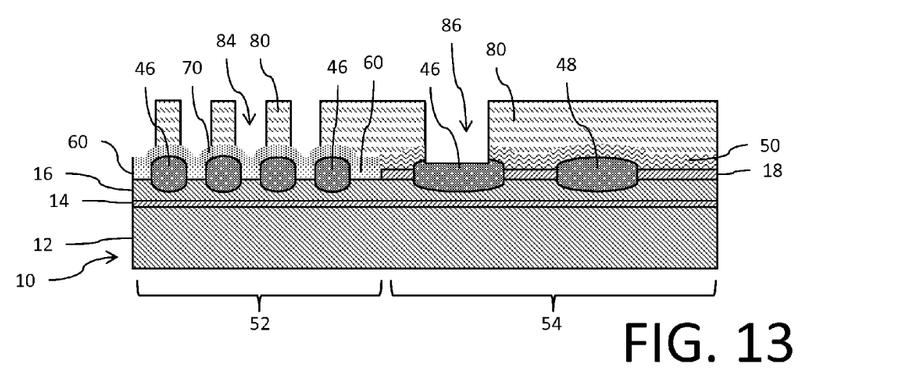

The Damascene process well known to those skilled in the art is then used to recess the dielectric layer 80 in certain locations to open a plurality of apertures 84 and 86. The apertures 84 are formed in the region 52 using a mask and etch at locations generally positioned between adjacent gate regions 46 so as to expose the source regions formed by the epitaxial layer 70. The apertures 86 are formed in an adjacent region 54 of the wafer 10 using a mask and etch at locations generally positioned so as to expose the gate region 46. The result is shown in FIG. 13.

In this regard, it will be understood that the gate region 46 in the region 54 of the wafer 10 is electrically coupled to the gate regions 46 in the region 52 of the wafer 10. More specifically, the region 54 may comprise a peripheral region of a to-be-formed integrated circuit chip within the wafer 10 and the region 52 may comprise a central region within the to-be-formed integrated circuit chip. The region 54 may, in an embodiment, extend to completely surround the region 52. In another embodiment, the region 54 may bound the region 52 on two or more sides. The electrical connection between the gate regions 46 is illustrated in FIG. 19, for example, to be provided by intersections of the regions 46 extending through the central region 52 with the region(s) 46 extending along the peripheral region 54. Reference line A-A in FIG. 19 shows an example of where the cross-section of FIGS. 1-18 is taken. Reference line B-B in FIG. 19 shows another example of where the cross-section of FIGS. 1-18 is taken.

Figure 14:
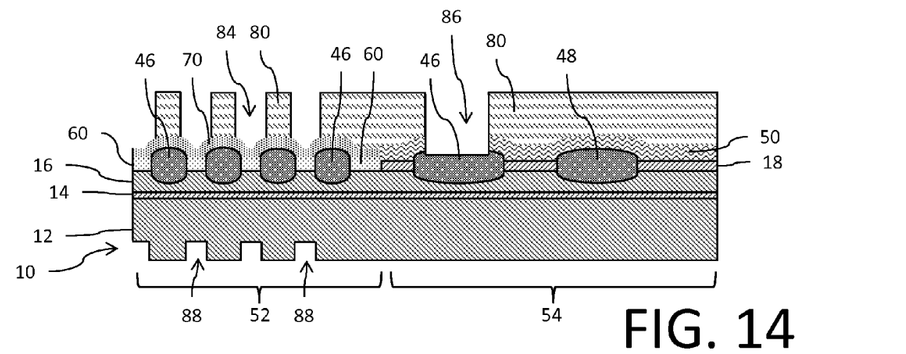

The Damascene process well known to those skilled in the art is then used to recess the SiC substrate wafer 12 in certain locations to open a plurality of apertures 88 on the bottom surface of the wafer 10. The apertures 88 are formed in the region 52 using a mask and etch at locations generally positioned to vertically align with the apertures 84. The result is shown in FIG. 14. The SiC substrate wafer 12 in the region 52 forms the drain region of the transistor.

Figure 15:
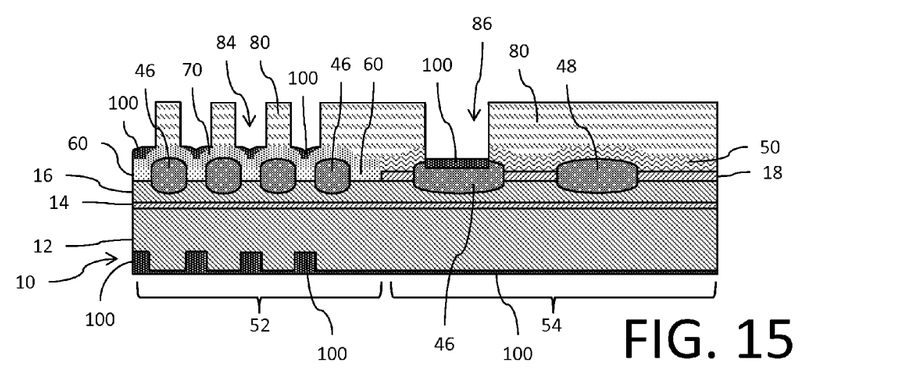

The ohmic contacts 100 for the source region and drain region are then formed as shown in FIG. 15 using a salicidation process as well known to those skilled in the art. A thin metal film is deposited on a) the silicon carbide (SiC) material for the substrate wafer 12 (including within the apertures 88) in region 52, b) the epitaxial layer 70 (within the apertures 84) in region 52, and c) the gate region 46 (within the aperture 86) in region 54. The metal film may, for example, comprise nickel (Ni), with the film having a thickness of 500-1000 Å. The wafer 10 is subjected to a thermal anneal process that causes the Ni to alloy with the SiC to form nickel silicide (Ni$_x$Si, wherein x comprises, for example, 2) contacts 100. The thermal anneal process may include multiple anneals at different temperatures. In an embodiment, at least a final anneal in the process is performed at a temperature of 850°-1000° C.

Figure 16:
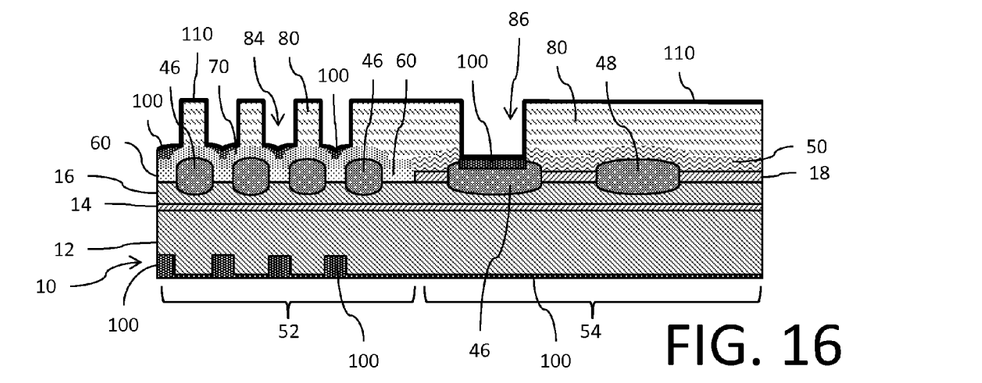

A metal liner 110 is then deposited on the wafer 10 in the regions 52 and 54 as shown in FIG. 16. The deposition of the metal liner 110 is conformal, and thus the liner 110 covers the top surfaces of the dielectric layer 80 as well as the sidewall and bottoms of the apertures 84 and 86. The metal liner 110 may comprise, for example, titanium (Ti), titanium nitride (TiN), titanium tungsten (TiW) or tantalum nitride (TaN). The liner 110 has a thickness of 1-10 nm, and is deposited using a PVD process.

Figure 17:
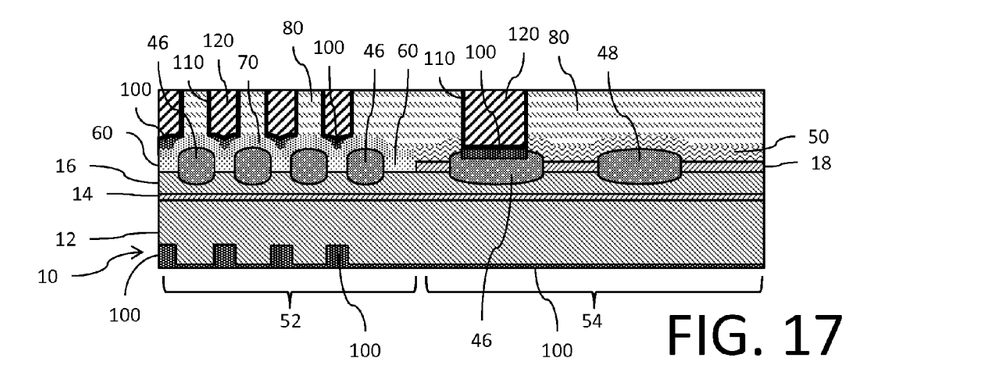

Metal for the source and gate connections 120 is then deposited within and filling the apertures 84 and 86. The deposit may, for example, be made using a chemical vapor deposition (CVD) or plating process. The metal for the connections 120 may, for example, comprise tungsten (W), aluminum (Al), copper (Cu) or gold (Au). In an embodiment, the metal used for the source connections in apertures 84 may differ from the metal used for the gate connections in apertures 86. For example, the source connections can use the metal, or alloys thereof, disclosed above, while the gate connections can use titanium (Ti), platinum (Pt) or gold (Au), or alloys thereof. The deposition of metal to fill the apertures 84 and 86 will likely result in the deposit of metal on the top surface of the dielectric layer 80. A chemical-mechanical polishing (CMP) process as known to those skilled in the art may be used to remove excess metal deposit on the top surface of layer 80. The result is shown in FIG. 17.

Metal for the drain connection 130 is then deposited on the back side of the wafer 10 on the drain ohmic contact 100. The deposit may, for example, be made using a CVD or plating process. The metal for the connection 130 is selected for die attach suitability and may, for example, comprise: a) a deposited silicon layer for a gold/silicon (Au/Si) eutectic die attach, b) an alloy or layered structure formed of titanium, platinum and gold (Ti/Pt/Au), c) an alloy or layered structure formed of titanium, nickel and gold (Ti/Ni/Au), or d) any other convention die attach metal known by those skilled in the art. The result is shown in FIG. 18.

Figure 18:
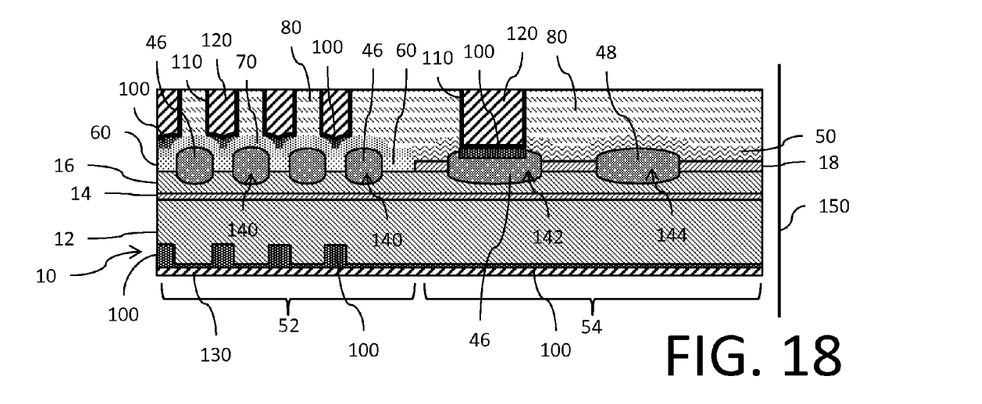
Figure 19:
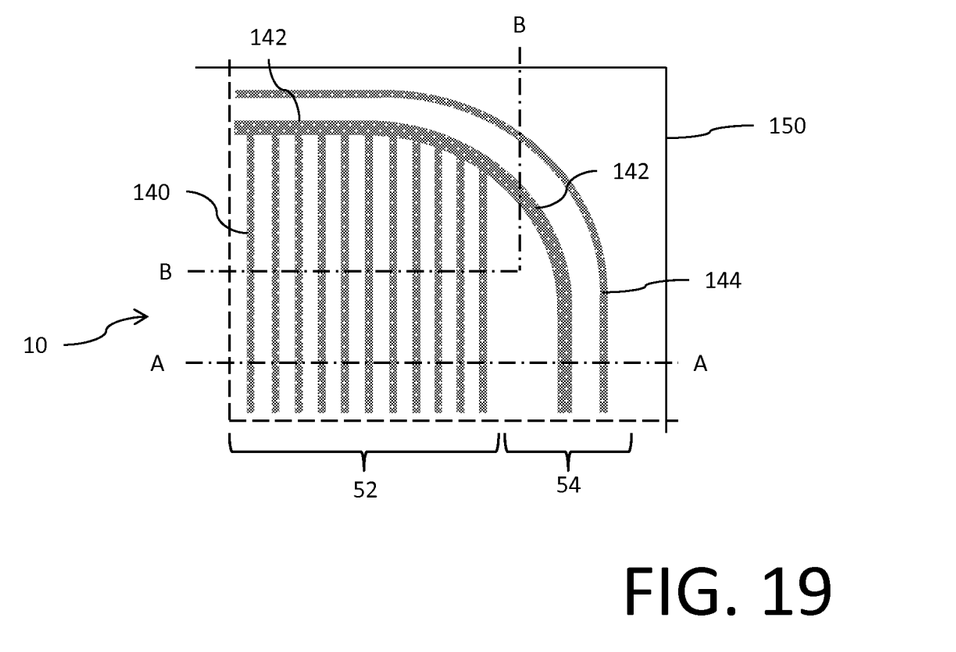
FIG. 19 is a plan view of the SIT.

The cross-section of the completed SiC SIT device is shown in FIG. 18. A plan view of the SiC SIT device is shown in FIG. 19, this plan view showing only a portion (for example, one-quarter) of the overall device. The device includes a plurality of gate fingers 140 formed by the p+ gate regions 46 in the region 52. The device further includes a gate lead 142 formed by the gate region 46 in the peripheral region 54. The gate fingers 140 are electrically connected to and extend perpendicularly from the gate lead 142. The device further includes a guard ring 144 formed by the guard region 48 in the peripheral region 54. The guard ring 144 is typically an electrically floating structure. The source region of the device is formed by the n+ epitaxial silicon carbide (SiC) layer 70. The channel regions of the device are formed by the regrown n− epitaxial silicon carbide (SiC) layer 60. The drain region of the device is formed by the n+ silicon carbide (SiC) substrate layers (12, 14, 16) of wafer 10.

The wafer 10 may next be diced into individual integrated circuit chips. FIGS. 18 and 19 illustrate at reference 150 an example location for the scribe line when dicing the wafer 10. Following dicing of the wafer 10, the individual chips are subjected to conventional back-end-of-line (BEOL) processing and packaging actions well known to those skilled in the art.

The SiC SIT device presents a number of advantages over prior art circuits including: the process is implant free so as to obviate concerns with SiC substrate damage; the channel region is formed of epitaxially grown material with in situ dopant; the source and drain Damascene recess process for contact formation provides an increased ohmic contact area and permits fabrication of structures with reduced contact resistance; the process for fabrication is compatible with shrinking process nodes; the n-type channel of the device has a novel shape supporting the formation of a fully depleted area when turning the transistor off and for providing reduced $C_{gg}$ and increased $g_m$ that is well suited for achieving high frequency device operation; the hard mask material filling the recessed regions 32 supports a self-aligned process for channel formation without requiring an additional lithographic process step; the process supports a self-aligned operation for opening the source contact; the process completes the device fabrication in fewer steps at a lower cost.

Although making and using various embodiments are discussed in detail herein, it should be appreciated that as described herein are provided many inventive concepts that may be embodied in a wide variety of contexts. Embodiments discussed herein are merely representative and do not limit the scope of the invention.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A static induction transistor (SIT), comprising:
  a silicon carbide substrate doped with a first conductivity type and including a plurality of first recessed regions in a top surface of the silicon carbide substrate;
  a plurality of epitaxial gate regions within the first recessed regions having an in situ second conductivity type dopant;
  a plurality of epitaxial channel regions positioned between adjacent epitaxial gate regions having an in situ first conductivity type dopant; and
  a plurality of epitaxial source regions on said plurality of epitaxial channel regions having an in situ first conductivity type dopant.

2. The SIT of claim 1, wherein the plurality of epitaxial gate regions are configured as gate fingers, and further comprising a gate lead which is electrically coupled to the gate fingers.

3. The SIT of claim 2, wherein the silicon carbide substrate further includes a second recessed region in the top surface of the silicon carbide substrate, and wherein the gate lead comprises an epitaxial gate lead region within the second recessed region having an in situ second conductivity type dopant.

4. The SIT of claim 3, further comprising a dielectric layer overlying the plurality of epitaxial source regions and covering the epitaxial gate lead region, the dielectric layer including a gate contact opening filled with a metal material to form a gate contact to the gate lead region.

5. The SIT of claim 1, wherein the silicon carbide substrate further includes an additional recessed region in the top surface of the silicon carbide substrate, further comprising an epitaxial guard region within the additional recessed region having an in situ second conductivity type dopant.

6. The SIT of claim 5, wherein the guard region forms a guard ring.

7. The SIT of claim 1, wherein the silicon carbide substrate further includes a plurality of second recessed regions in a bottom surface of the silicon carbide substrate, said second recessed regions being vertically aligned with the epitaxial channel regions positioned between adjacent epitaxial gate regions.

8. The SIT of claim 7, further comprising a silicide material formed in said plurality of second recessed regions.

9. The SIT of claim 1, further comprising a silicide material formed on each of the plurality of epitaxial source regions.

10. The SIT of claim 1, wherein the plurality of epitaxial source regions further extend to cover over the plurality of epitaxial gate regions.

11. The SIT of claim 1, further comprising a dielectric layer overlying the plurality of epitaxial source regions, the dielectric layer including a plurality of source contact openings filled with a metal material to form source contacts.

12. A static induction transistor (SIT), comprising:
  a first layer of silicon carbide doped with a first conductivity type dopant to form a drain region and including a plurality of first recesses in a top surface of said first layer of silicon carbide;

a gate region within each first recess, said gate region formed by epitaxial silicon carbide doped with a second conductivity type dopant;

a channel region positioned between adjacent gate regions, said channel region formed by epitaxial silicon carbide doped with the first conductivity type dopant; and a second layer of silicon carbide doped with the first conductivity type dopant overlying the gate regions to form a source region.

13. The SIT of claim 12, wherein each gate regions defines a gate finger, and further comprising a gate lead which is electrically coupled to the gate fingers and formed by epitaxial silicon carbide doped with the second conductivity type dopant.

14. The SIT of claim 13, further comprising a dielectric layer overlying the second layer, the dielectric layer including a gate contact opening filled with a metal material to form a gate contact to the gate lead.

15. The SIT of claim 12, wherein the first layer of silicon carbide further includes an additional recess in the top surface of said first layer of silicon carbide, further comprising a guard region within the additional recess formed by semiconductor material doped with the second conductivity type dopant.

16. The SIT of claim 15, wherein the semiconductor material is silicon carbide.

17. The SIT of claim 15, wherein the additional recess has a ring shape substantially surrounding the first recesses and the guard region forms a guard ring.

18. The SIT of claim 12, further comprising a dielectric layer overlying the second layer, the dielectric layer including a source contact opening filled with a metal material to form a source contact to the source region.

19. The SIT of claim 12, further comprising a third layer of silicon carbide underneath the first layer of silicon carbide, wherein the third layer of silicon carbide includes a plurality of second recesses in a bottom surface of the third layer of silicon carbide, each second recess being vertically aligned with one of the channel regions.

20. The SIT of claim 19, further comprising a silicide material formed in said plurality of second recesses.

21. The SIT of claim 12, further comprising a silicide material formed on said source region.

22. A static induction transistor (SIT), comprising:

a silicon carbide substrate doped with a first conductivity type dopant at a first dopant concentration to form a drain region and including a plurality of first recesses in a top surface of said silicon carbide substrate;

a gate region within each first recess, said gate region formed by epitaxial silicon carbide doped with a second conductivity type dopant;

a channel region positioned between adjacent gate regions, said channel region formed by epitaxial silicon carbide doped with the first conductivity type dopant at a second dopant concentration less than said first dopant concentration; and a source region positioned between adjacent gate regions over each channel region and formed by epitaxial silicon carbide doped with the first conductivity type dopant at a third dopant concentration more than said second dopant concentration.

23. The SIT of claim 22 further comprising a silicide material on each source region and a silicide material on a bottom surface of the silicon carbide substrate.

24. The SIT of claim 22, wherein the third dopant concentration is more than the first dopant concentration.

* * * * *